US007834453B2

(12) United States Patent
Chang

(10) Patent No.: US 7,834,453 B2
(45) Date of Patent: Nov. 16, 2010

(54) CONTACT STRUCTURE HAVING A COMPLIANT BUMP AND A TEST PAD

(75) Inventor: Shyh-Ming Chang, Hsinchu (TW)

(73) Assignees: Taiwan TFT LCD Association, Hsinchu (TW); Chunghwa Picture Tubes, Ltd., Taoyuan (TW); Au Optronics Corporation, Hsinchu (TW); Hannstar Display Corporation, Taipei County (TW); Chi Mei Optoelectronics Corporation, Tainan County (TW); Industrial Technology Research Institute, Hsinchu (TW); TPO Displays Corp., Miao-Li County (TW)

( * ) Notice: Subject to any disclaimer, the term of this patent is extended or adjusted under 35 U.S.C. 154(b) by 56 days.

(21) Appl. No.: 11/762,729

(22) Filed: Jun. 13, 2007

(65) Prior Publication Data

US 2008/0023832 A1    Jan. 31, 2008

Related U.S. Application Data

(63) Continuation-in-part of application No. 11/603,909, filed on Nov. 24, 2006.

(30) Foreign Application Priority Data

Jul. 28, 2006   (TW) .............................. 95127901 A
Oct. 26, 2006   (TW) .............................. 95139501 A
Jan. 16, 2007   (TW) .............................. 96101568 A

(51) Int. Cl.
*H01L 23/48*    (2006.01)
*H01L 21/44*    (2006.01)

(52) U.S. Cl. .............................. 257/737; 257/E23.021; 257/E23.068; 257/E23.01; 257/E21.476; 257/690; 257/780; 257/781; 257/783; 257/784

(58) Field of Classification Search .................. 257/734, 257/737, 738, 780, 690, 686, E23.021, E23.589, 257/E23.01, E21.476, E23.068, 781, 783
See application file for complete search history.

(56) References Cited

U.S. PATENT DOCUMENTS

| 5,508,228 | A | * | 4/1996 | Nolan et al. ................. 438/614 |
| 5,707,902 | A | * | 1/1998 | Chang et al. ................. 438/614 |
| 5,877,556 | A | * | 3/1999 | Jeng et al. .................... 257/737 |
| 6,537,854 | B1 | | 3/2003 | Chang et al. |
| 6,563,215 | B1 | * | 5/2003 | Akram et al. ................ 257/737 |
| 7,154,176 | B2 | * | 12/2006 | Huang et al. ................ 257/737 |
| 2005/0275422 | A1 | * | 12/2005 | Luh et al. .................... 324/765 |
| 2008/0023830 | A1 | * | 1/2008 | Chang et al. ................ 257/737 |
| 2008/0294011 | A1 | * | 11/2008 | McLoughlin ............... 600/210 |
| 2009/0243093 | A1 | * | 10/2009 | Chang ......................... 257/737 |
| 2009/0246988 | A1 | * | 10/2009 | Yang et al. .................... 439/86 |

FOREIGN PATENT DOCUMENTS

TW         487998        5/2002

OTHER PUBLICATIONS

"Notice of Allowance of Taiwan Counterpart Application" issued on Jun. 24, 2010, p. 1-p. 4, in which the listed reference was cited.

* cited by examiner

*Primary Examiner*—Alexander O Williams
(74) *Attorney, Agent, or Firm*—Jianq Chyun IP Office

(57) ABSTRACT

A contact structure including a contact pad, a polymer bump and a conductive layer is provided in the present invention. The contact pad is disposed on a substrate. The polymer bump is disposed on the contact pad. The conductive layer covers the polymer bump and extends to the outside of the polymer bump. The portion of the conductive layer extending to the outside of the polymer bump serves as a test pad. The invention further discloses a manufacturing method of a contact structure. First, a substrate is provided having a contact pad already formed thereon. Then, a polymer bump is formed on the contact pad and a conductive layer is formed on the polymer bump. The conductive layer covers the polymer bump and extends to the outside of the polymer bump. The portion of the conductive layer extending to the outside of the polymer bump serves as a test pad.

13 Claims, 5 Drawing Sheets

CONTACT STRUCTURE HAVING A COMPLIANT BUMP AND A TEST PAD

CROSS-REFERENCE TO RELATED APPLICATION

This is a continuation-in-part application of patent application Ser. No. 11/603,909 filed on Nov. 24, 2006 which claims the priority benefit of Taiwan patent application serial no. 95127901, filed Jul. 28, 2006. This application also claims the priority benefit of Taiwan applications serial no. 95139501 and 96101568, filed on Oct. 26, 2006 and Jan. 16, 2007, respectively. The entirety of each of the above-mentioned patent applications is hereby incorporated by reference herein and made a part of this specification.

BACKGROUND OF THE INVENTION

1. Field of the Invention

The present invention relates to a contact structure and a manufacturing method thereof, especially to a contact structure having a compliant bump and a test pad and a manufacturing method thereof.

2. Description of Related Art

In the field of forming the integrated circuits (IC) of high density, chips need physical structures and electrical structures that are highly reliable. In order to manufacture within a micro area IC structures of high density, such as liquid crystal panels of high resolution, the control IC used for driving also needs to be closely arranged. Hence, the metal bump on the wafer is used as the conductive contact to serve the purpose.

The U.S. Pat. No. 5,707,902 discloses a bump structure mainly constituted by three film layers (metal layer-polymer layer-metal layer). Since the bump structure includes two metal layers, the depth thereof is so thick that it is difficult to control the evenness of etching. As a result, bump structures with fine line distances cannot be successfully made.

Further, the bump structure disclosed in the U.S. Pat. No. 5,508,228 has a top surface narrower than its bottom surface. After the metal layer is formed on the bump structure, a probe is used to contact the metal layer on the bump structure so as to proceed with an electrical test. However, given that the top surface of the bump structure is narrower than the bottom surface thereof, when the electrical test is performed, the probe usually slides off causing the electrical test to fail.

SUMMARY OF THE INVENTION

The present invention provides a contact structure having a compliant bump and a test pad located on the outside the compliant bump to solve the conventional problem of a sliding probe during an electrical test.

The invention provides a method of manufacturing a contact structure. The contact structure manufactured by the method has a compliant bump and a test pad located on the outside of the compliant bump.

The invention provides a contact structure including a contact pad, a compliant bump and a conductive layer. The contact pad is disposed on a substrate. The polymer bump is disposed on the contact pad. The conductive layer covers the polymer bump and extends to the outside of the polymer bump. The portion of the polymer bump covered by the conductive layer forms the so-called compliant bump. The portion of the conductive layer extending to the outside of the polymer bump serves as a test pad.

The invention further discloses a manufacturing method of a contact structure. First, a substrate is provided and a contact pad has already been formed thereon. Afterwards, a polymer bump is formed on the contact pad. Then, a conductive layer is formed on the polymer bump. The conductive layer covers the polymer bump and extends to the outside of the polymer bump. The portion of the conductive layer extending to the outside of the polymer bump serves as a test pad.

In the invention, the conductive layer covering the polymer bump extends to the outside of the polymer bump and the portion of the conductive layer extending to the outside of the polymer bump serves as a test pad. Therefore, when a probe is used to conduct an electrical test, the probe can perform the test on the test pad of a large area so that the probe can be prevented from sliding off.

In order to make the aforementioned and other objects, features and advantages of the present invention more comprehensible, preferred embodiments accompanied with figures are described in detail below.

DESCRIPTION OF EMBODIMENTS

Figure 1:
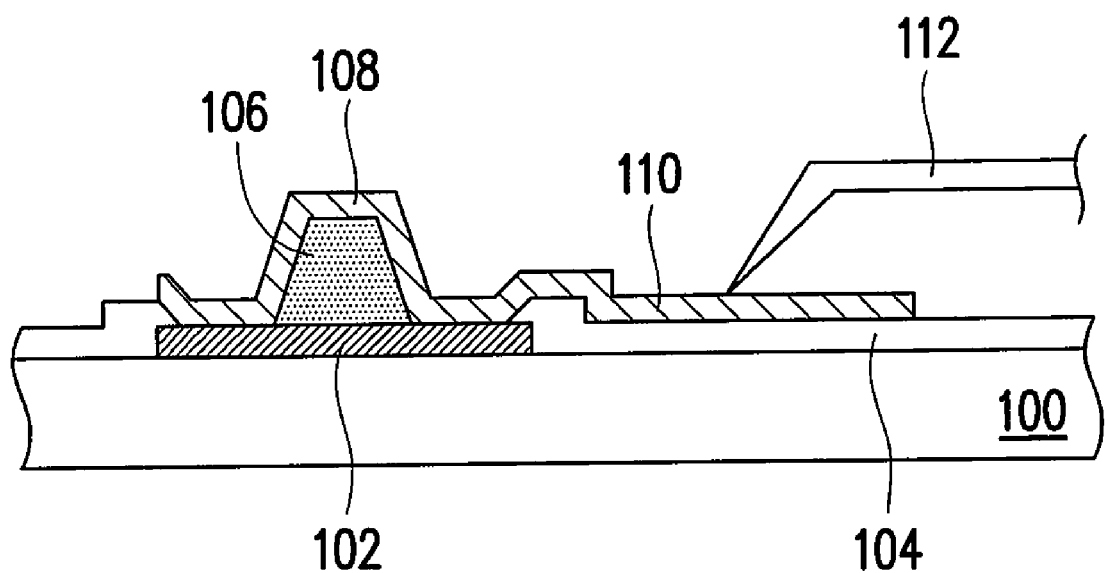
FIG. 1 is a schematic cross-sectional view showing a contact structure and the steps of an electrical test thereof according to one embodiment of the present invention.

FIG. 1 is a schematic cross-sectional view showing a contact structure and the steps of an electrical test thereof according to one embodiment of the present invention. Referring to FIG. 1, in a manufacturing method of the contact structure, a substrate 100 is first provided and a contact pad 102 has already been formed thereon. The substrate 100 may be a silicon substrate, a glass substrate, a printed circuit board, a flexible circuit board or a ceramic substrate. Many electronic elements or integrated circuits (ICs) may have already been formed in the substrate 100. The material of the contact pad 102 may be metal. The method of forming the contact pad 102 may be depositing a metal layer on the substrate 100. Afterwards, the metal layer is patterned by a photolithography process and an etching process to form the contact pad 102. In one preferred embodiment, after the contact pad 102 is formed, a protective layer 104 is further formed on the substrate 100 and exposes the contact pad 102. The material of the protective layer 104 may be silicon nitride or other suitable dielectric materials.

Figure 7A:
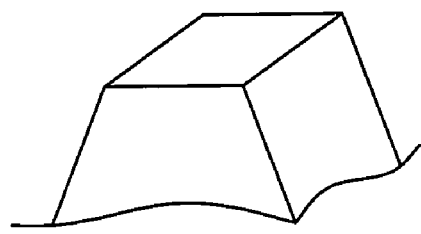
FIGS. 7A-7F are schematic views showing shapes of the polymer bumps in the embodiments of the invention.
Figure 7B:
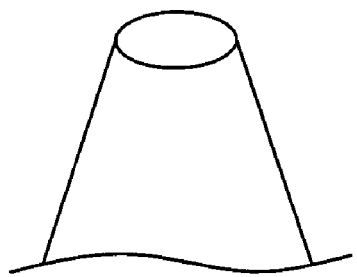
Figure 7C:
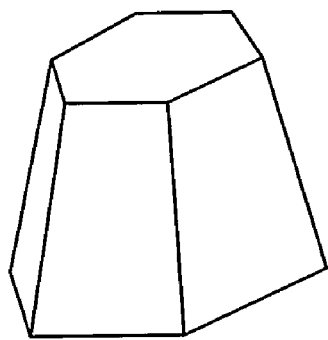
Figure 7D:
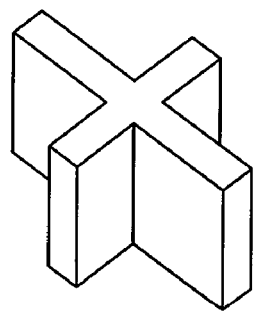
Figure 7E:
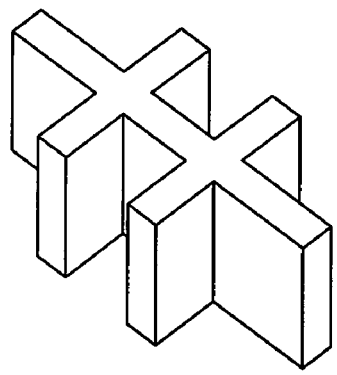
Figure 7F:
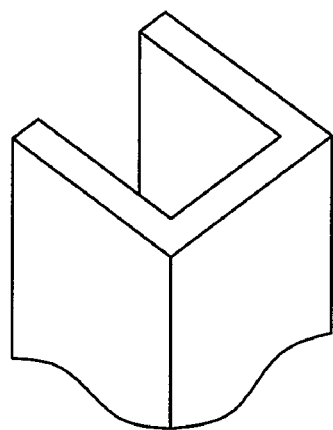

Then, a polymer bump 106 is formed on the contact pad 102. The material of the polymer bump 106 may be polyimide (PI), epoxy, or acrylic. If the material of the polymer bump 106 is photosensitive, the polymer bump 106 can be formed by a photolithography process. If the material of the polymer bump 106 is non-photosensitive, the polymer bump 106 can be formed by a photolithography process and an etching process. The polymer bump 106 in a horizontal cross-sectional view may be rectangular (as shown in FIG. 7A), circular (as shown in FIG. 7B), polygonal (as shown in FIG. 7C), cross-shaped (as shown in FIG. 7D), double-cross-shaped (as shown in FIG. 7E), U-shaped (as shown in FIG. 7F) or in other shapes. The invention does not limit the shape of the polymer bump 106.

Afterwards, a conductive layer 108 is formed on the polymer bump 106. The conductive layer 108 covers the polymer bump 106 and extends to the outside of the polymer bump 106. The portion of the conductive layer 108 extending to the outside of the polymer bump 106 serves as a test pad 110. The polymer bump 106 and the conductive layer 108 formed thereon constitute a compliant bump. The conductive layer 108 may extend toward anywhere in the outside of the polymer bump 106, depending on the design of an actual element. In one embodiment of the invention, the material of the conductive layer 108 may be metal. The conductive layer 108 may completely cover the polymer bump 106 (as shown in FIG. 1) or partially cover the polymer bump 106 (not shown).

Hence, the contact structure formed by the said manufacturing method includes a contact pad 102, a polymer bump 106 and a conductive layer 108. The contact pad 102 is disposed on a substrate 100. The polymer bump 106 is disposed on the contact pad 102. The conductive layer 108 covers the polymer bump 106 and extends to the outside of the polymer bump 106. The portion of the conductive layer 108 extending to the outside of the polymer bump 106 serves as a test pad 110.

The conductive layer 108 covering the polymer bump 106 extends to the outside of the polymer bump 106. The portion of the conductive layer 108 extending to the outside of the polymer bump 106 serves as a test pad. Thus, when a probe 112 is used to conduct an electrical test, the probe 112 can perform the test on the test pad 110 of a large area. Compared with the conventional method, where a probe needs to be put on the conductive layer on top of the polymer bump to perform an electrical test, the present invention has a larger and smooth test pad for the test to be conducted on so that the probe is prevented from sliding off.

Figure 2:
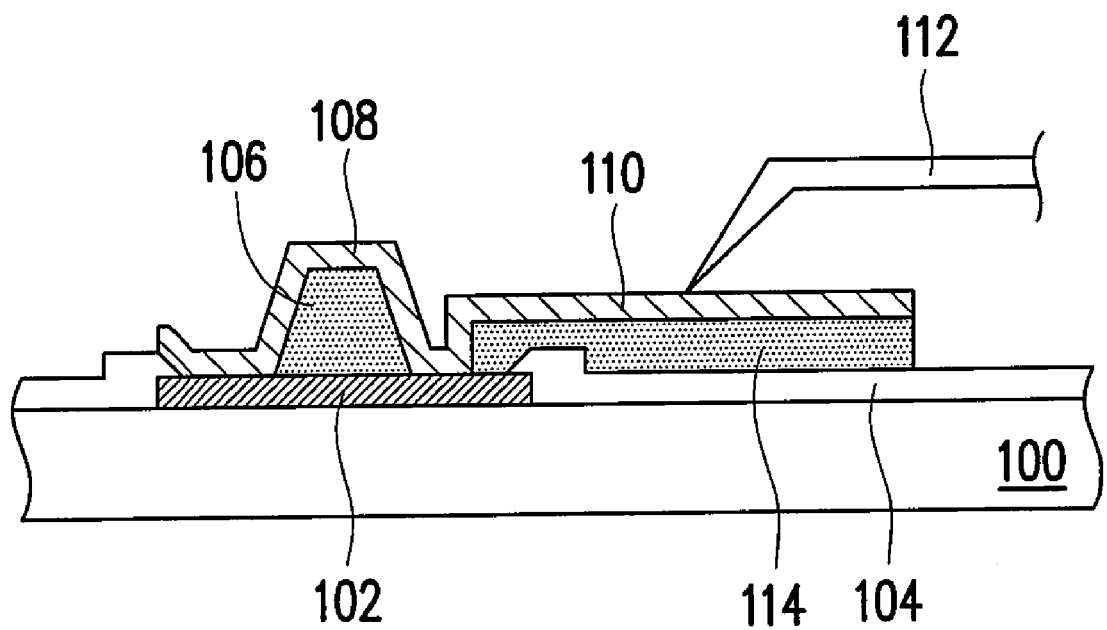
FIGS. 2-6 are schematic cross-sectional views showing contact structures and the steps of electrical tests thereof according to other embodiments of the invention.

According to another embodiment of the invention, the contact structure of the invention further includes an extending layer 114, as shown in FIG. 2, disposed between the test pad 110 and the substrate 100 (or the protective layer 104). The material of the extending layer 114 may be the same as or different from the material of the polymer bump 106. The extending layer 114 may be formed simultaneously as the polymer bump 106 by the same masking process. Furthermore, the height of the extending layer 114 is smaller than or equal to the height of the polymer bump 106.

Figure 3:
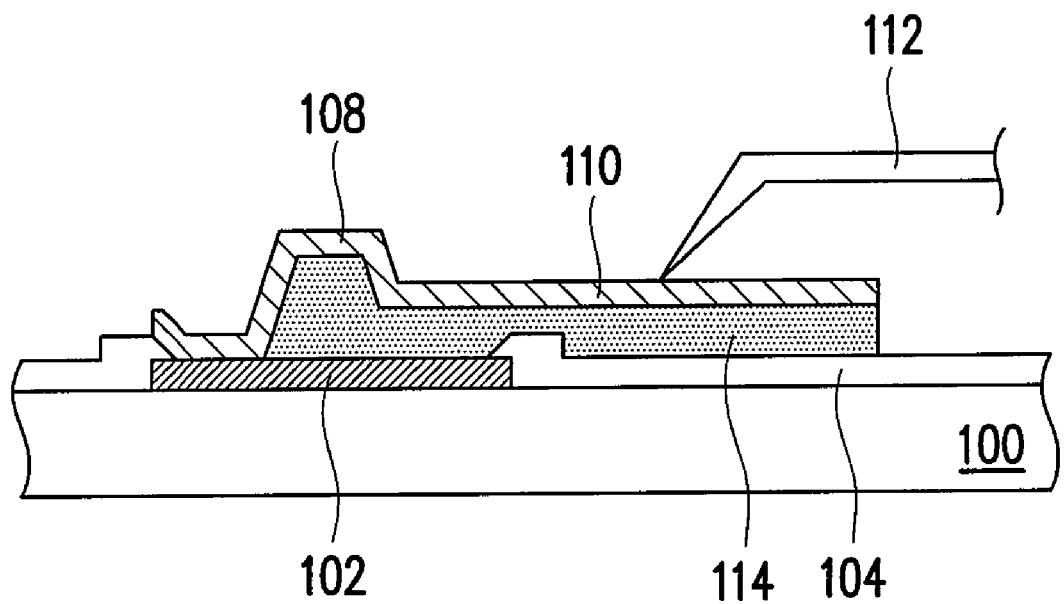

In addition, the extending layer 114 and the polymer bump 106 as illustrated in FIG. 2 are separate from each other. Nevertheless, in fact, the extending layer 114 and the polymer bump 106 may also be connected together, as shown in FIG. 3. The main function of the extending layer 114 is protecting the electronic elements or ICs in the substrate 100 under the test pad 110 from damage caused by the probe 112 when a probe 112 is used to perform an electrical test. If the extending layer 114 and the polymer bump 106 are connected together (as shown in FIG. 3), the extending layer 114 may also strengthen the firmness of the polymer bump 106 and the extending layer 114 so as to prevent the polymer bump 106 and the extending layer 114 from coming off.

Figure 4:
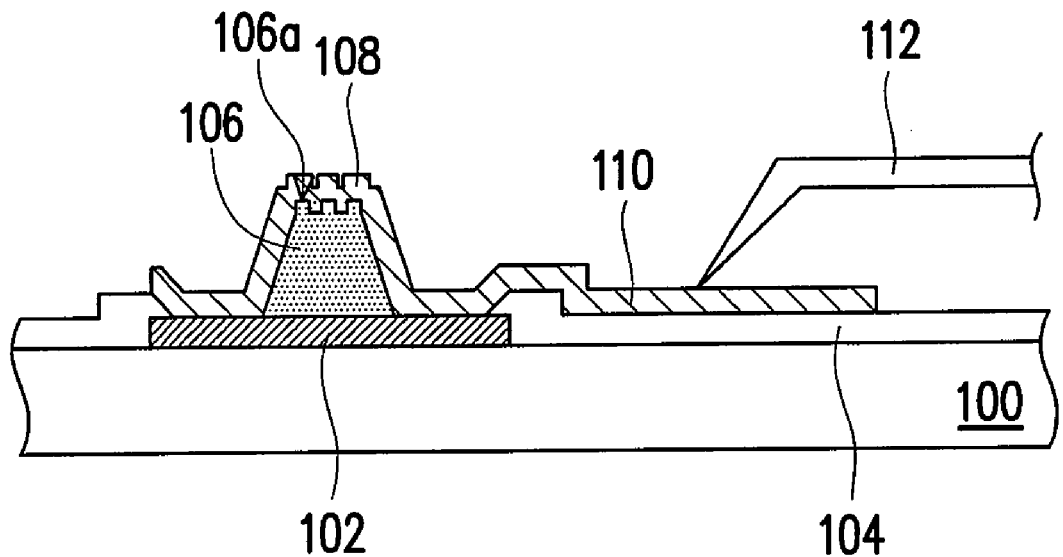
Figure 5:
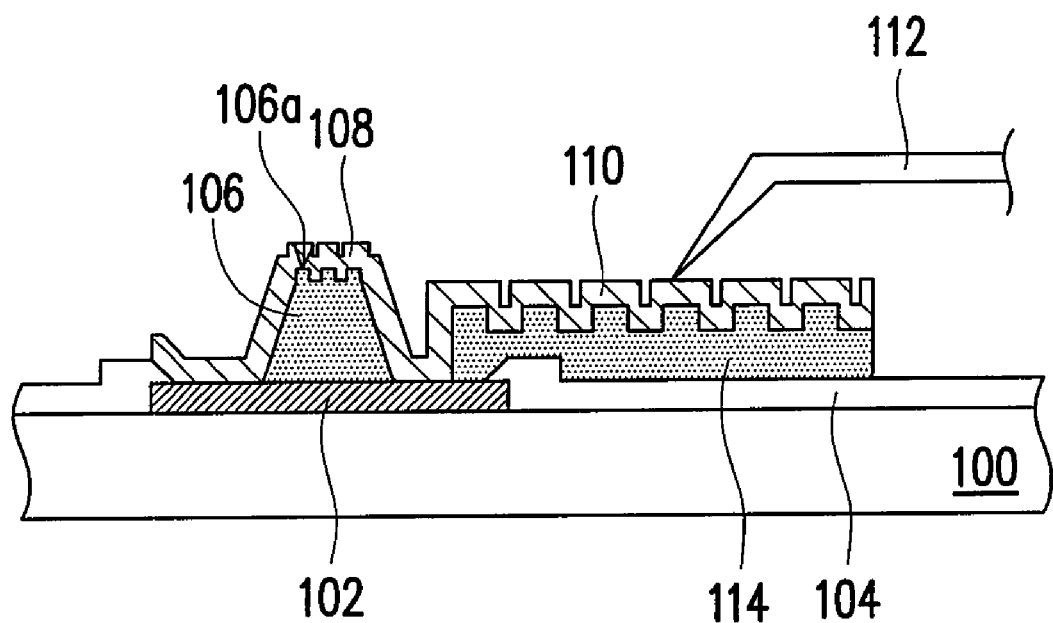
Figure 6:
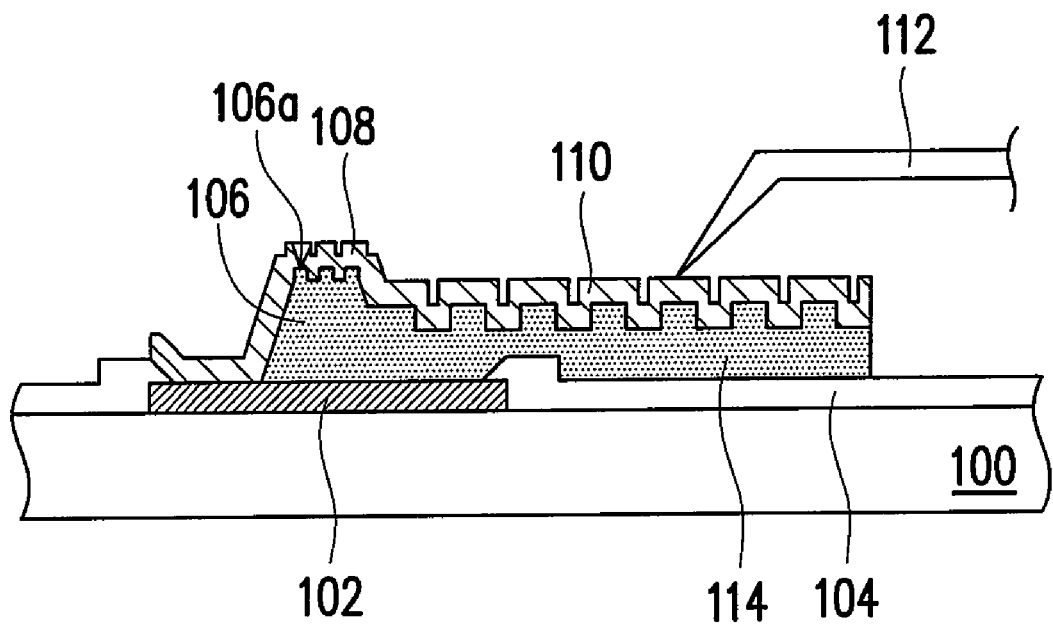

In the embodiments of FIGS. 1-3, the upper surface of the polymer bump 106 is a smooth surface, but the present invention is not limited to these examples. The upper surface of the polymer bump 106 in the invention may also be a rough surface as shown in FIG. 4. Referring to FIG. 4, the contact structure thereof is similar to that of FIG. 1. The difference between them is that the upper surface of the polymer bump 106 in FIG. 4 is a rough surface 106a, and the rough surface 106a may be constituted by a plurality of protrusion structures, a plurality of recess structures or a plurality of groove-shaped structures. In one embodiment, the rough surface 106a is formed simultaneously as the polymer bump 106 by a method such as a gray level masking process. Moreover, the contact structure shown in FIG. 5 is similar to the contact structure of FIG. 2. They both include an extending layer 114 separate from the polymer bump 106. Their difference is that in the contact structure of FIG. 5 the upper surface of the polymer bump 106 is a rough surface 106a. Besides, the upper surface of the extending layer 114 may also be a rough surface, and it may be constituted by a plurality of protrusion structures, a plurality of recess structures or a plurality of groove-shaped structures. The contact structure shown in FIG. 6 is similar to the contact structure of FIG. 3. They both include an extending layer 114 connected with the polymer bump 106. Their difference is that in the contact structure of FIG. 6 the upper surface of the polymer bump 106 is a rough surface 106a. Similarly, the upper surface of the extending layer 114 in FIG. 6 may also be a rough surface, and it may be constituted by a plurality of protrusion structures, a plurality of recess structures or a plurality of groove-shaped structures.

In the foregoing embodiments, whether the contact structure includes an extending layer and whether the upper surface of the polymer bump is a rough surface, their common feature is that the conductive layer covering the polymer bump extends to the outside of the polymer bump and the portion of the conductive layer extending to the outside of the polymer bump serves as a test pad. Therefore, afterwards, when a probe is used to perform an electrical test, the probe can perform the electrical test on a test pad of a large area so that the probe can be prevented from sliding off.

Besides, the conductive layer served as the test pad extends from the surface of the compliant bump towards anywhere in the outside thereof to form a test pad of a large area. Hence, the present invention does not require an additional area for the test pad so that the space for the electronic elements or ICs in the substrate is not occupied or wasted.

If an extending layer is further formed under the test pad, the extending layer can protect the electronic elements or ICs in the substrate so as to prevent the electronic elements or ICs from damage caused when the probe is used to perform the electrical test.

Although the present invention has been disclosed above by the embodiments, they are not intended to limit the present invention. Anybody ordinarily skilled in the art can make some modifications and alterations without departing from the spirit and scope of the present invention. Therefore, the protecting range of the present invention falls in the appended claims.

What is claimed is:

1. A contact structure, comprising:
 a contact pad, disposed on a substrate;
 a polymer bump, directly disposed on the contact pad and exposing a portion of the contact pad; and
 a conductive layer, covering the polymer bump and extending to the outside of the polymer bump, wherein the conductive layer contacts the exposed contact pad, and the portion of the conductive layer extending to the outside of the polymer bump serves as a test pad, wherein the test pad is not directly disposed above the contact pad, and a length of the test pad directly disposed above the substrate is larger than a width of the polymer bump.

2. The contact structure of claim 1, further comprising an extending layer disposed between the substrate and the test pad.

3. The contact structure of claim 2, wherein the extending layer and the polymer bump are connected together or separate from each other.

4. The contact structure of claim 2, wherein the height of the extending layer is smaller than or equal to the height of the polymer bump.

5. The contact structure of claim 2, wherein the material of the extending layer is the same as or different from the material of the polymer bump.

6. The contact structure of claim 2, wherein the upper surface of at least one of the extending layer and the polymer bump is a smooth surface or a rough surface.

7. The contact structure of claim 6, wherein the rough surface is constituted by a plurality of protrusion structures, a plurality of recess structures or a plurality of groove-shaped structures.

8. The contact structure of claim 1, further comprising a protective layer disposed on the substrate and exposing the contact pad.

9. The contact structure of claim 1, wherein the material of the polymer bump comprises polyimide (PI), epoxy or acrylic.

10. The contact structure of claim 1, wherein the conductive layer completely covers the polymer bump or partially covers the polymer bump.

11. The contact structure of claim 1, wherein the substrate comprises a silicon substrate, a glass substrate, a printed circuit board, a flexible circuit board or a ceramic substrate.

12. The contact structure of claim 1, wherein the polymer bump in a horizontal cross-sectional view is rectangular, circular, polygonal, cross-shaped, double-cross-shaped or U-shaped.

13. A contact structure, comprising:
a contact pad, disposed on a substrate;
a polymer bump, directly disposed on the contact pad and exposing a portion of the contact pad;
a conductive layer, covering the polymer bump and contacting the exposed contact pad; and
a test pad, connecting to the conductive layer, wherein the test pad is disposed on the substrate and does not overlap with the contact pad, and a length of the test pad is larger than a width of the polymer bump.

* * * * *